United States Patent
Lvov et al.

(10) Patent No.: US 12,282,725 B2
(45) Date of Patent: Apr. 22, 2025

(54) ENHANCED ALIGNMENT FOR GLOBAL PLACEMENT IN A CIRCUIT

(71) Applicant: INTERNATIONAL BUSINESS MACHINES CORPORATION, Armonk, NY (US)

(72) Inventors: Alexey Y Lvov, Congers, NY (US); Gi-Joon Nam, Chappaqua, NY (US); Benjamin Neil Trombley, Hopewell Junction, NY (US); Lakshmi N Reddy, Mount Kisco, NY (US); Paul G Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 476 days.

(21) Appl. No.: 17/804,070

(22) Filed: May 25, 2022

(65) Prior Publication Data
US 2023/0385503 A1    Nov. 30, 2023

(51) Int. Cl.
*G06F 30/392*    (2020.01)
*G06F 30/27*    (2020.01)

(52) U.S. Cl.
CPC ............ *G06F 30/392* (2020.01); *G06F 30/27* (2020.01)

(58) Field of Classification Search
USPC ........................................................ 716/123
See application file for complete search history.

(56) References Cited

U.S. PATENT DOCUMENTS

| 6,662,348 | B1 | 12/2003 | Naylor et al. |
| 7,984,410 | B2 | 7/2011 | Chen et al. |
| 8,635,576 | B2 | 1/2014 | Zhao et al. |
| 8,689,164 | B2 | 4/2014 | Balabanov et al. |
| 9,558,313 | B1 * | 1/2017 | Siddiqi ................. G06F 30/394 |
| 10,031,996 | B2 | 7/2018 | Braun et al. |
| 10,346,578 | B2 | 7/2019 | Patel et al. |
| 10,346,587 | B2 | 7/2019 | Stamper et al. |
| 10,528,695 | B1 | 1/2020 | Lvov et al. |
| 10,552,740 | B2 | 2/2020 | Alpert et al. |
| 10,599,882 | B1 | 3/2020 | Werkheiser et al. |
| 10,635,773 | B1 | 4/2020 | Kim et al. |
| 10,719,654 | B2 | 7/2020 | Beck et al. |
| 10,762,271 | B2 | 9/2020 | Kim et al. |
| 2013/0086534 | A1 | 4/2013 | Zhao et al. |
| 2013/0097574 | A1 | 4/2013 | Balabanov et al. |

(Continued)

FOREIGN PATENT DOCUMENTS

| CN | 106021722 A | 10/2016 |
| CN | 106980730 A | 7/2017 |

OTHER PUBLICATIONS

Zhou et al., "A monte carlo tree search framework for quantum circuit transformation", ICCAD'20: Proceedings of the 39th International Conference on Computer-Aided Design, Nov. 2020, Article No. 138, pp. 1-7 https://doi.org/10.1145/3400302.3415621 (28 pages).

(Continued)

*Primary Examiner* — Bryce M Aisaka
(74) *Attorney, Agent, or Firm* — Matthew Zehrer

(57) ABSTRACT

Embodiments are provided for enhanced initial global placement in a circuit design in a computing system by a processor. A wire length minimization may be determined based on maximum population density constraints as a single player game theory for global placement of an integrated circuit.

20 Claims, 10 Drawing Sheets

(56) References Cited

U.S. PATENT DOCUMENTS

| | | |
|---|---|---|
| 2020/0034507 A1 | 1/2020 | Lvov et al. |
| 2020/0104453 A1 | 4/2020 | Kim et al. |
| 2021/0117608 A1 | 4/2021 | Chung et al. |

OTHER PUBLICATIONS

Roy et al., "Seeing the forest and the trees: steiner wirelength optimization in placement, IEEE Transactions on Computer-Aided Design on Integrated Circuits and Systems", 26(4):632-644, 2007, DOI:10.1109/TCAD.2006.888260 (8 pages).

Ho et al., "Fast legalization for standard cell placement with simultaneous wirelength and displacement minimization", VLSI-SoC 2010: 369-374, DOI: 10.1109/VLSISOC.2010.5642689 2012, (21 pages).

He et al., "Circuit routing using monte carlo tree search and deep neural networks", ArXiv:https://doi.org/10.48550/arXiv.2006.13607, Artificial Intelligence, 2020, (8 pages).

Mirhoseini et al., "Chip placement with deep reinforcement learning", ArXiv: https://doi.org/10.48550/arXiv.2004.10746, Apr. 2020, (15 pages).

Kim et al., "SimPL: An effective placement algorithm", IEEE Transactions on Computer-Aided Design of Integrated Circuits and Systems, 31:50-60, DOI:10.1109/ICCAD.2010.5654229, Jan. 2012 (13 pages).

Baier et al., "Evolutionary MCTS with Flexible Search Horizon", Proc. Of the 14th Artificial Intelligence and Interactive Digital Entertainment Conference (AIDE 2018). 2018 (7 pages).

Liu et al., "Density-based penalty parameter optimization on C-SVM", Hindawi Publishing Corporation, The Scientific World Journal, vol. 2014, Article ID 851814, http://dx.doi.org/10.1155/2014/851814 (10 pages).

Maes et al., "Monte carlo search algorithm discovery for single-player games", IEEE Transactions on Computational Intelligence and AI in Games, vol. 5, No. 3, Sep. 2013, https://doi.org/10.48550/arXiv.1208.4692 (13 pages).

Prabhakar et al., "Optimization of placement for modern VLSI design", International Conference on VLSI, Communication & Instrumentation (ICVCI) 2011, Published in International Journal of Computer Applications (IJCA), No. 2, Article 1, 2011, (5 pages).

* cited by examiner

11.33% Average Wire Length Improvement

| | | 40-50% | 50-60% | 60-70% | 70-80% | 80-90% | 90-100% |
|---|---|---|---|---|---|---|---|
| LS_EXFL_MAC: 1652 s. (CPLACE/ALV)-1.0: 16.57% | Density: 0.5682 | | | | | | |
| CPLACE WL = 12412252 | | 32 | 381 | 89 | 13 | 0 | 0 |
| ALV WL = 10647688 | | 26 | 396 | 95 | 4 | 0 | 0 |
| VS_CY_MAC: 5998 s. (CPLACE/ALV)-1.0: 11.59% | Density: 0.8563 | | | | | | |
| CPLACE WL = 37452080 | | 0 | 0 | 0 | 5 | 787 | 8 |
| ALV WL = 33562440 | | 1 | 1 | 5 | 17 | 752 | 22 |
| MC_CY_MAC: 1652 s. (CPLACE/ALV)-1.0: 9.13 | Density: 0.4000 | | | | | | |
| CPLACE WL = 328641180 | | 445 | 45 | 3 | 1 | 0 | 0 |
| ALV WL = 301159160 | | 1528 | 37 | 3 | 0 | 0 | 0 |
| DLP_RX_LANE: 1652 s. (CPLACE/ALV)-1.0: 17.14% | Density: 0.8965 | | | | | | |
| CPLACE WL = 12412252 | | 0 | 0 | 0 | 0 | 204 | 0 |
| ALV WL = 10647688 | | 0 | 0 | 1 | 2 | 155 | 4893 |
| PC_PMU_IMA: 1652 s. (CPLACE/ALV)-1.0: 2.21% | Density: 0.5562 | | | | | | |
| CPLACE WL = 12412252 | | 32 | 381 | 89 | 13 | 0 | 0 |
| ALV WL = 10647688 | | 26 | 396 | 95 | 4 | 0 | 0 |

FIG. 9

ENHANCED ALIGNMENT FOR GLOBAL PLACEMENT IN A CIRCUIT

BACKGROUND

The present invention relates in general to computing systems, and more particularly, to various embodiments for providing enhanced initial global placement in an integrated circuit using a computing processor.

SUMMARY

According to an embodiment of the present invention, a method providing enhanced initial global placement in an integrated circuit of in a computing environment, by one or more processors, in a computing system. A wire length minimization may be determined based on maximum population density constraints as a single player game theory for global placement of an integrated circuit.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

Thus, in addition to the foregoing exemplary method embodiments, other exemplary system and computer product embodiments are provided.

BRIEF DESCRIPTION OF THE DRAWINGS

FIG. 9 is table diagram depicting average wire length improvement in which aspects of the present invention may be realized.

DETAILED DESCRIPTION OF THE DRAWINGS

Figure 1:
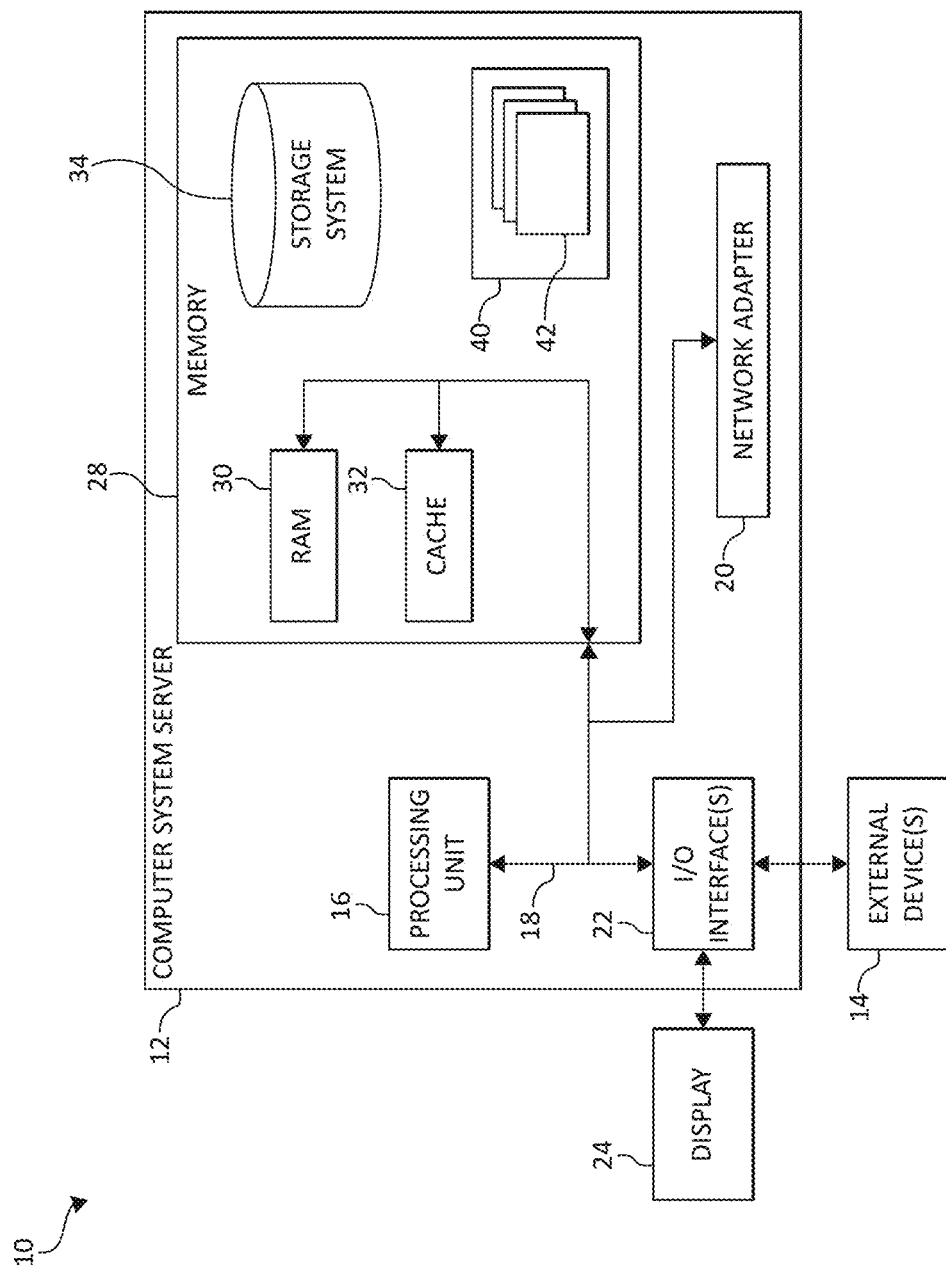
FIG. 1 is a block diagram depicting an exemplary cloud computing node according to an embodiment of the present invention.

The present invention relates generally to the field of electrical, electronic, and computer arts. An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". Moreover, the IC chip may include a large number of electronic components that are fabricated by layering several different materials on a silicon base or wafer. The design of an IC transforms a circuit description into a geometric description which is known as a layout. A layout typically consists of a set of planar geometric shapes in several layers. A generated layout has to be checked to ensure that it meets all of the design requirements. The result of this check is a set of design files in a particular unambiguous representation known as an intermediate form that describes the layout. The design files are then converted into pattern generator files that are used to produce patterns called "masks" by an optical or electron beam pattern generator.

The process of converting the functional specifications of an electronic circuit into the layout is called the physical design. The objective of the physical design is to determine an optimal arrangement of devices in a plane or in a three-dimensional space, and an efficient interconnection or routing scheme between the devices to obtain the desired functionality. The physical design of a microelectronic IC commonly is an automated optimization process using digital computers and specialized Computer Aided Design (CAD) tools. Automation of the physical design process has increased the level of integration, reduced turn-around time and enhanced chip performance.

For the physical design of ICs, prefabricated elements are used that provide combinatorial or storage functions. These elements are called cells (or types). A collection of different cells forms a library. The usage of a cell in a design is referred to as instance or circuit. If most of cells have the same height and connect their power through abutted placement in circuit row, the cells are called standard cells and the design style standard cell layout. A particular design element of an IC is a so-called "pin" which refers to a physical or logical access terminal to a cell and circuit. An example for a pin is an inverter having one input and one output pin.

The mentioned instances of an IC are interconnected or routed in accordance with the logical design of the circuit to provide the desired functionality. Hereby the various elements of the circuit are interconnected by electrically conductive lines or traces that are routed through vertical channels and horizontal channels that run between the cells.

In addition, IC chips typically have several metal layers upon which the wires are routed with the horizontal wires routed on different layers than the vertical wires. An electrical connection between two nets on adjacent layers is implemented using a so-called "via" which is an etched hole in a substrate's oxide for allowing a conductive path to extend from one layer to another layer of the underlying IC chip, that can be used e.g., for conducting power (so-called "power via") or even signals. The routing program must therefore produce a list of horizontal and vertical segments for each net, connected by the mentioned vias, all of which have to be conformal with the underlying technology requirements, also known as 'ground rules', for wire spacing and wire capacity.

Challenges arise in the initial global placement, which is a mathematically challenging problem, which arises at the earliest stage of design flow. Achieving a high-quality solution of global placement sets a favorable course for all the subsequent stages and leads to a very significant quality of result. A circuit in global placement is represented by a set of rectangular blocks which are connected by wires and must fit into a given bounding box without creating over-populated regions or excessive wire length.

Accordingly, the present invention provides a novel solution by providing enhanced initial global placement in an integrated circuit of in a computing environment, by one or more processors, in a computing system. A wire length minimization may be determined based on maximum population density constraints as a single player game theory for global placement of an integrated circuit. Thus, the present invention provides, for example, an approximate solution to the wire length minimization challenge by providing increased wire placement such as, for example, greater than and/or equal to at least ("≥11%") wire length improvement compared with other operations for initial global placement.

In some implementations, the present invention may model the problem of wire length minimization under maximum population density constraints as a single player game with perfect information and to use the single player game theory of such games in order to obtain a better solution. For example, one move of the game is a pair of layout transformations: a partial contraction transformation of the layout towards the minimum wire length placement followed by a spreading transformation which fixes population density violations attempting not to sacrifice too much of the wire length. The former can be done effectively by solving a specially formulated linear program while for the latter the present invention may use a randomized greedy algorithm.

In other implementations, the present invention provides for an evolutionary tree search to mimic a process of natural selection on one or more nodes of the decision tree. The survival of an individual (e.g., a tree node) depends only on the figure of merit of its offspring (e.g., offspring node of the tree node, but not on the F.O.M. of itself.

In terms of placement this means that the objective function of a coarse grid placement is not based on its own wire length ("WL"), but completely depends on the average WL of fine grids which it has produced so far. Similarly, to the concept of a sacrifice in a single game (e.g., chess), the present invention may sacrifice a quality (e.g., wire length) of the current coarse solution (e.g., intermediate tree node) in order to produce/identify more efficient, enhanced, optimized, or better final solutions (leaf node) in the future.

The operation of producing an offspring (a leaf node) of a current decision tree node is made by randomized Linear Programming Shrink-Spread Refinement.

Also, as used herein, a shrink operation is where a linear optimization problem is constructed and solved, which objective function penalizes for both the total half perimeter wire length and the deviation from the parent node (which shapes are evenly spread shapes across the bounding box). A spread operation is defined as continuously moving shapes of a design (e.g., IC design) by small distances, attempting to increase wire length as less as possible, until the overpopulation constraints, broken by the "shrink" operation, are no longer violated in any region of the design Also, as used herein, "optimize" may refer to and/or defined as "maximize," "minimize," "best," or attain one or more specific targets, objectives, goals, or intentions. Optimize may also refer to maximizing a benefit to a user (e.g., maximize a trained machine learning pipeline/model benefit). Optimize may also refer to making the most effective or functional use of a situation, opportunity, or resource.

Additionally, optimizing need not refer to a best solution or result but may refer to a solution or result that "is good enough" for a particular application, for example. In some implementations, an objective is to suggest a "best" combination of preprocessing operations ("preprocessors") and/or machine learning models/machine learning pipelines, but there may be a variety of factors that may result in alternate suggestion of a combination of preprocessing operations ("preprocessors") and/or machine learning models yielding better results. Herein, the term "optimize" may refer to such results based on minima (or maxima, depending on what parameters are considered in the optimization problem). In an additional aspect, the terms "optimize" and/or "optimizing" may refer to an operation performed in order to achieve an improved result such as reduced execution costs or increased resource utilization, whether or not the optimum result is actually achieved. Similarly, the term "optimize" may refer to a component for performing such an improvement operation, and the term "optimized" may be used to describe the result of such an improvement operation.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
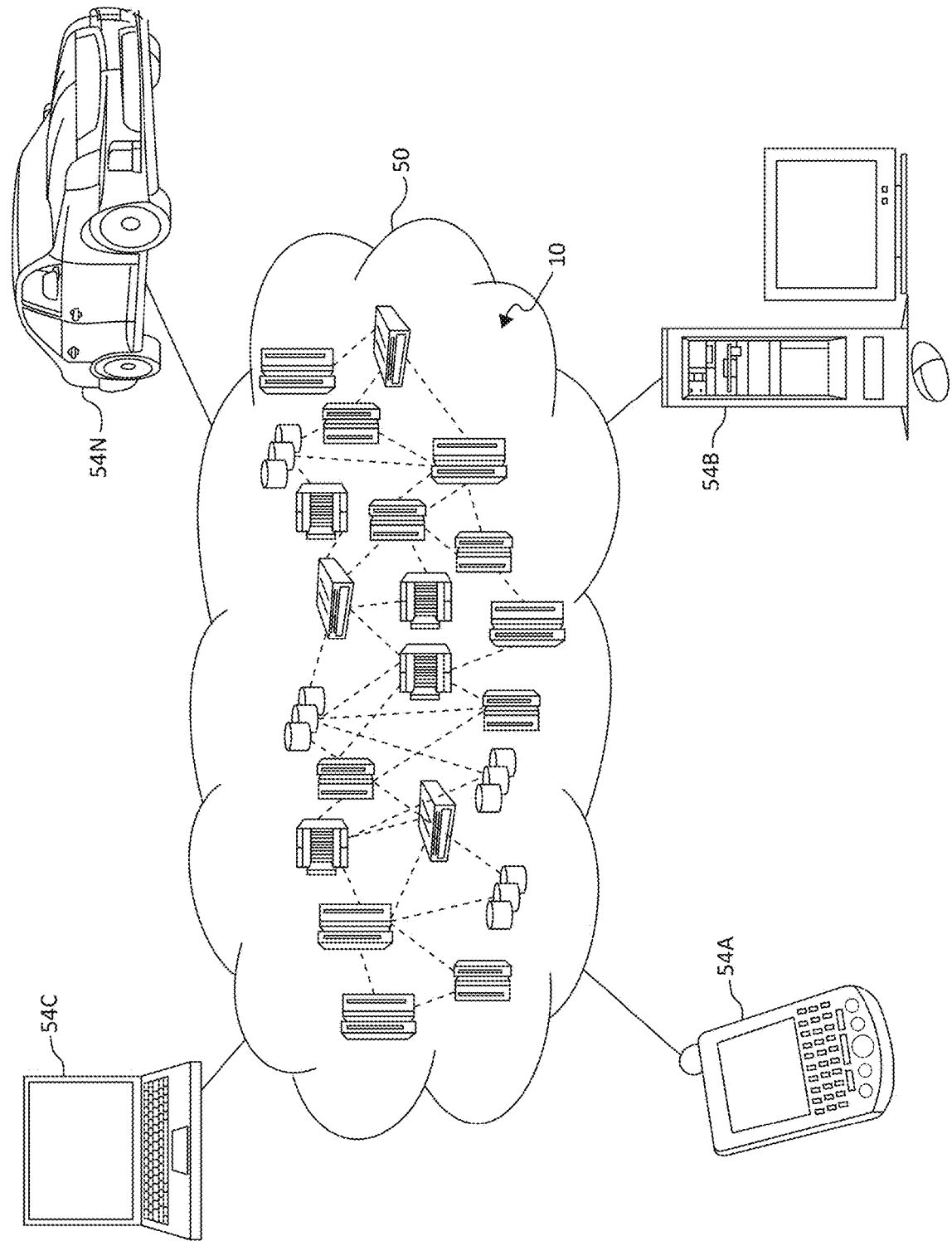
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
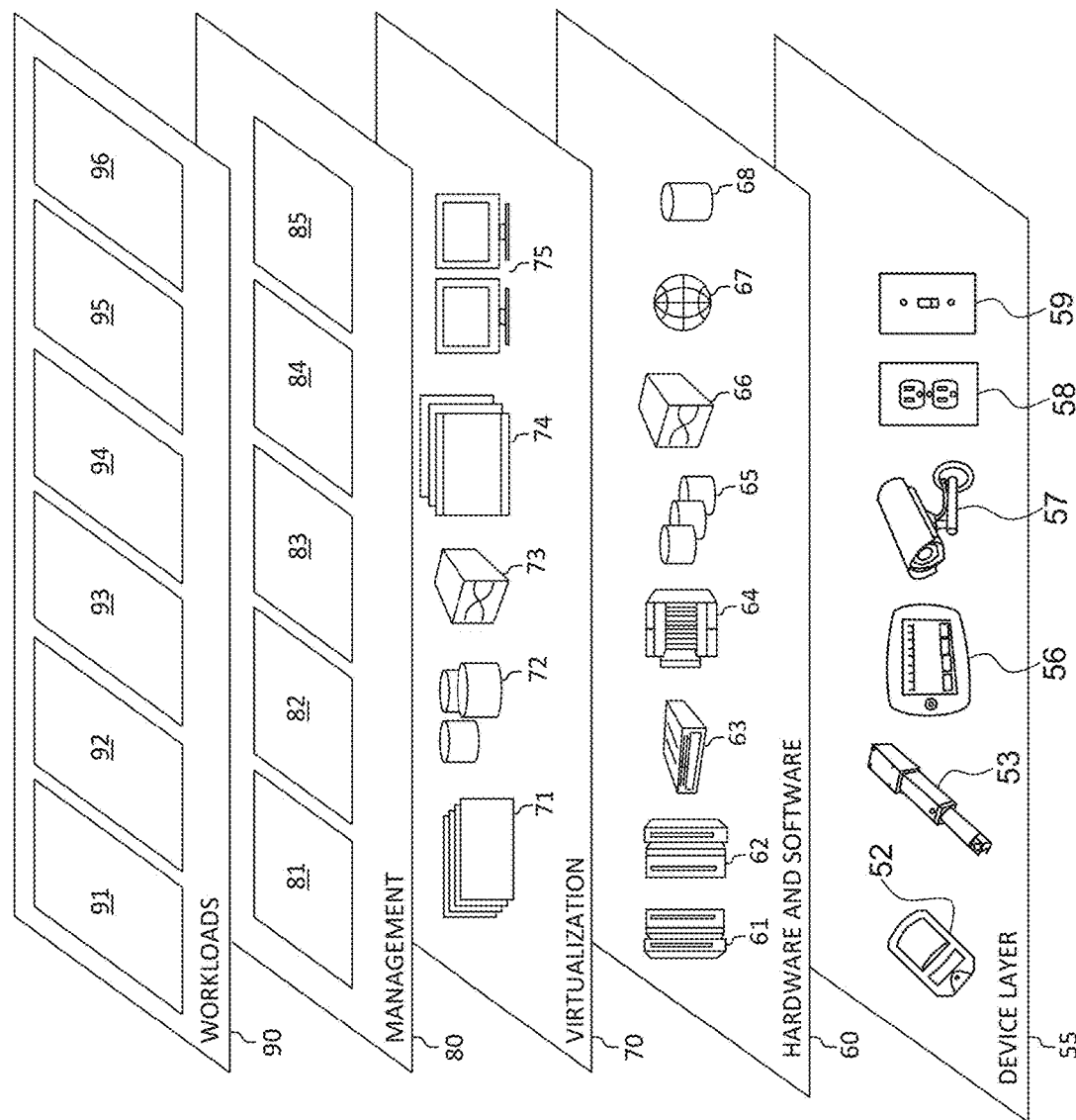
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 providing enhanced initial global placement in a computing environment (e.g., in a neural network architecture). In addition, workloads and functions 96 for providing enhanced initial global placement in a computing environment may include such operations as analytics, deep learning, and as will be further described, user and device management functions. One of ordinary skill in the art will appreciate that the workloads and functions 96 for providing enhanced initial global placement in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

As previously mentioned, the present invention provides novel solutions to the problem/challenge of global placement by providing enhanced initial global placement in an integrated circuit of in a computing environment by determining wire length minimization based on maximum population density constraints as a single player game theory for global placement of an integrated circuit. This is based on the fact that in global placement problem a circuit is represented by a set of rectangular blocks V with given widths and heights, which must stay within a bounding box of given sizes. Some of the blocks are marked as "fixed" and the other are marked as "movable" as depicted in equation 1:

$$V = F \cup M, \quad F \cap M = \emptyset \quad (1).$$

Figure 4:
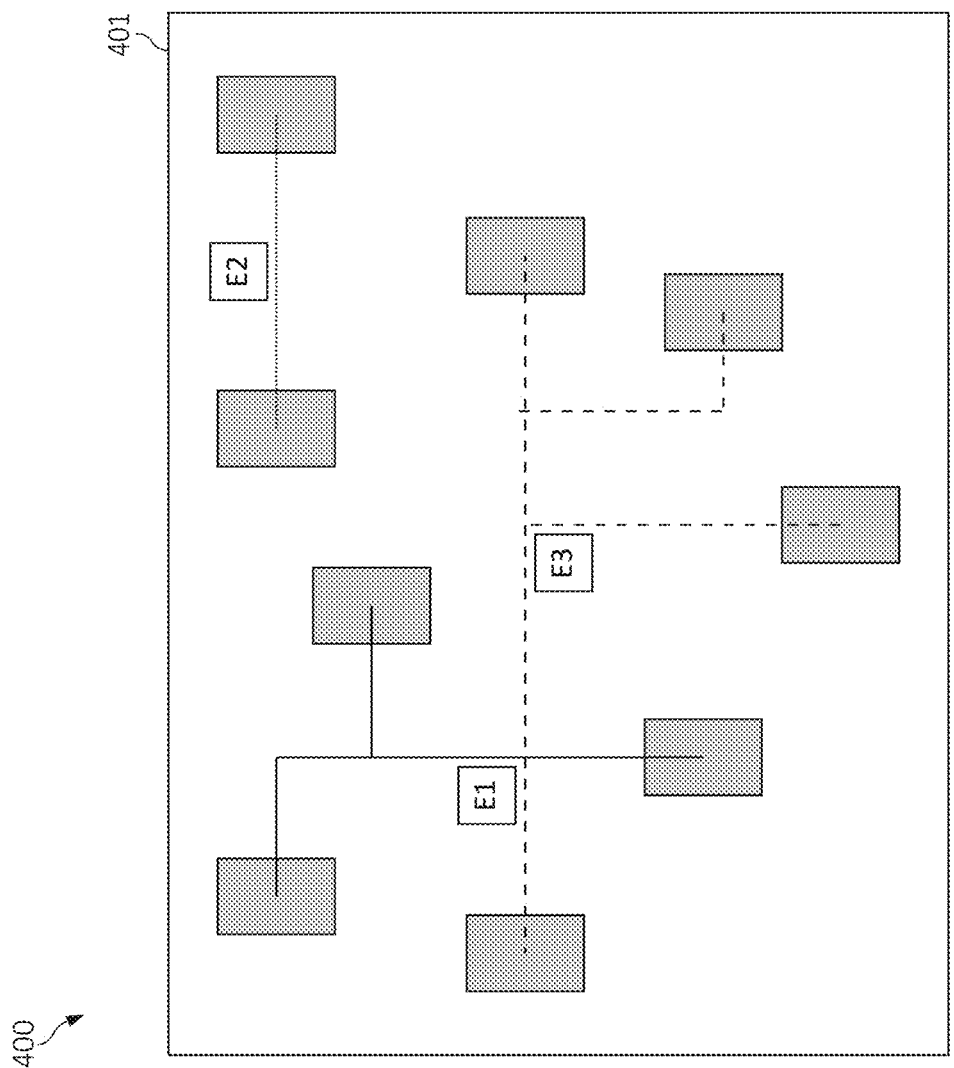
FIG. 4 shows a circuit in placement, wherein placement can be effectuated by aspects of the invention.

In addition to the set of blocks V, a number of subsets of V $\{E1, E2, \ldots, Em\}$ are given and are called nets. Blocks of each net must be connected by axis parallel wires. An optimal solution to the placement problem is a vector $(x_1, y_1, x_2, y_2, \ldots, x_{|M|}, y_{|M|})$ of coordinates of the centers of movable blocks which minimizes the total wire length without creating regions overpopulated with blocks anywhere in the design. For example, referring to FIG. 1, a circuit 401 in placement is represented as a set of rectangles or blocks (shown cross-hatched and not separately numbered to avoid clutter) with given widths and heights which must fit into a bounding box (outer rectangle not separately numbered to avoid clutter). This set is denoted by V. In addition to V itself, a number of subsets of V: E1, E2 . . . Em (in FIG. 4, E1, E2, E3) are given and are called nets.

Blocks of each net should be connected by wires (lines shown connecting cross-hatched rectangles and not separately numbered to avoid clutter). A good placement should minimize the total wire length without creating regions overpopulated with blocks anywhere in the design.

Figure 5:
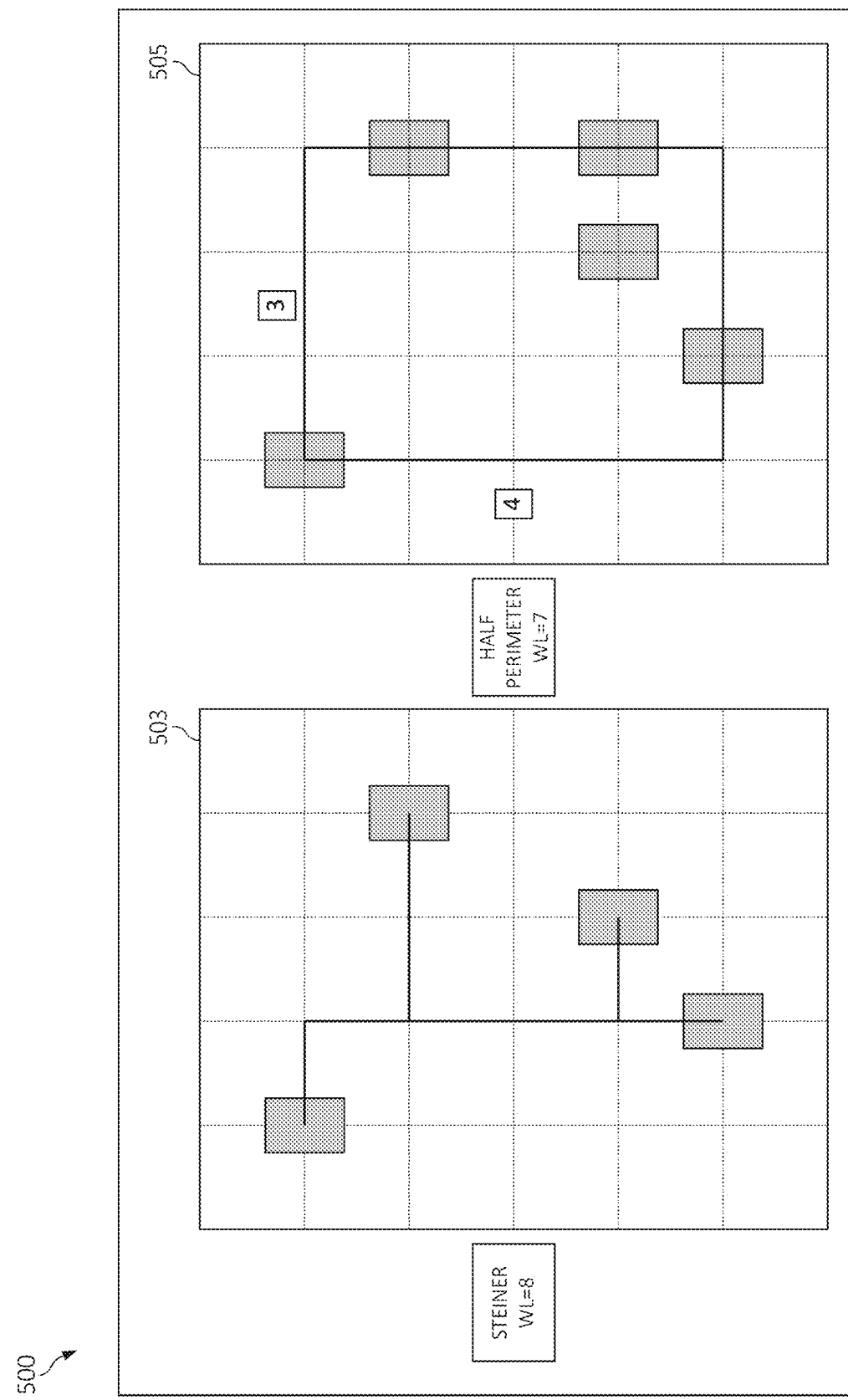
FIG. 5. shows Steiner wire length and half perimeter wire length for a placement problem, wherein placement can be effectuated by aspects of the invention.

Referring now to FIG. 5, as seen at 503, finding an exact minimum wire length, also called Steiner wire length, is a computationally expensive task even if the blocks are fixed, so in current placement tools it is traditionally replaced, as seen at 505, by the Half Perimeter Wire Length ("HPWL") approximation is:

$$HPWL(\text{net}) \stackrel{def}{=}$$

$$\max_{\text{all pins}}(x_i) - \min_{\text{all pins}}(x_i) + \max_{\text{all pins}}(x_i)(y_i) - \min_{\text{all pins}}(y_i), \quad (2)$$

$$HPWL(\text{design}) \sum\nolimits_{all\_nets}(HPWL(\text{net})).$$

Figure 6:
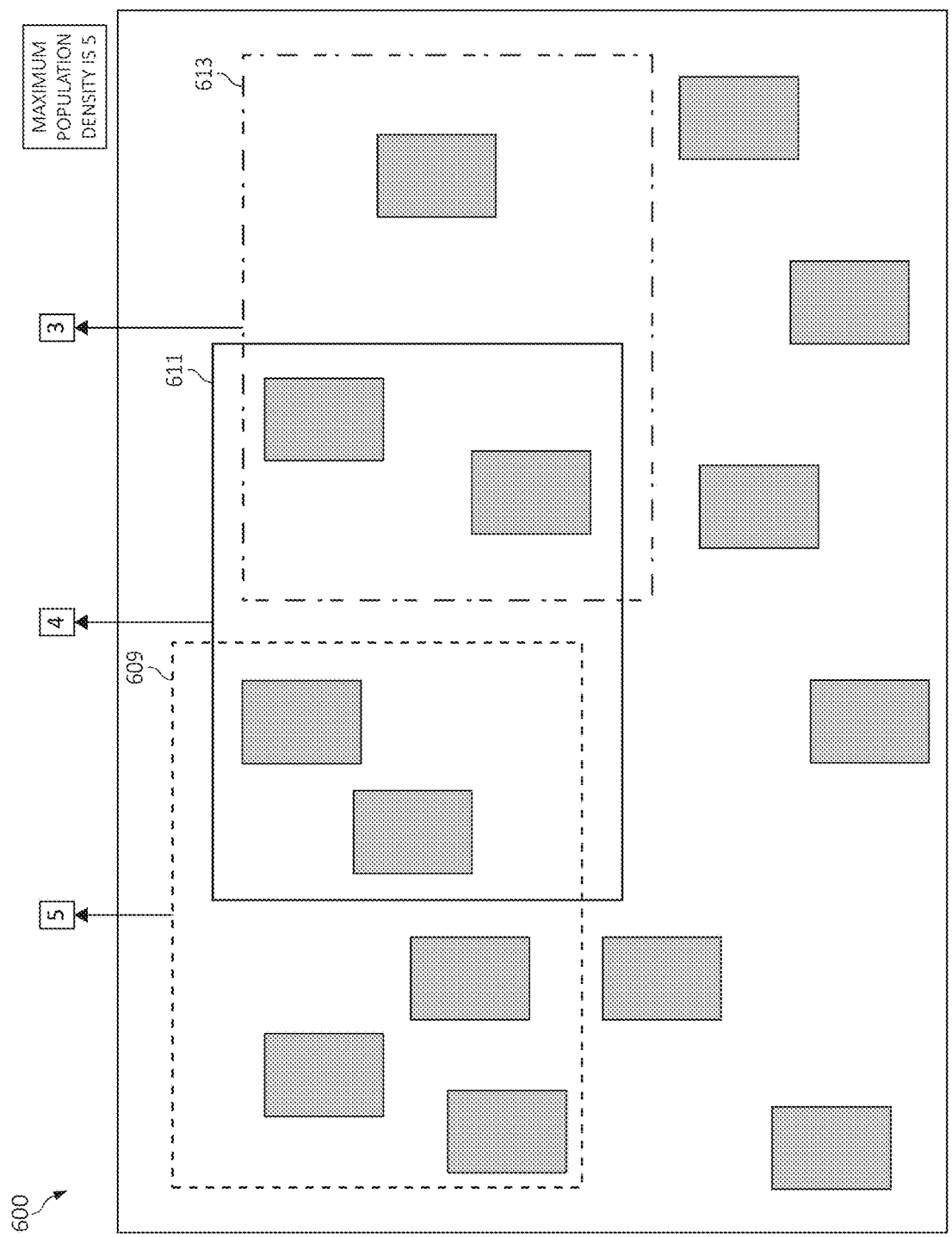
FIG. 6. shows maximum population aspects of placement, wherein placement can be effectuated by aspects of the invention.

Referring to 607 in FIG. 6, the maximum population can be defined as the maximum area occupied by blocks in a moving square window of a fixed size positioned anywhere within the bounding box (outer rectangle not separately numbered to avoid clutter). Let $f$ be the indicator function of the placement; that is, $f$ is equal to 1 at points covered by blocks and 0 elsewhere. Then, the maximum population is the maximum value of the convolution of $f$ and the indicator function of the window.

More generally, the maximum population can be defined as the maximum value of the convolution of $f$ and any non-negative convolution kernel such as a Gaussian bell. In the non-limiting example of FIG. 6, three successive window positions 609, 611, 613 are depicted, and the maximum population density is five (window 609 has 5 blocks; window 611 has 4 blocks; window 613 has 3 blocks).

At this point it should be noted that one or more embodiments employ an ALV operation wherein the objective is to minimize total weighted wire length under the maximum density constraint.

The ALV operation includes of three major parts.

First, the ALV operation includes definitions of two basic transformations of layout: "contraction" and "spreading". Also, concepts such as, for example, placement indicator function, convolution kernel, maximum population density constraints, etc. may be included in the definitions.

Second, the ALV operation includes reformulation of global placement problem as a single player game with perfect information. Also, the initial position and the rules by which a move in the game is made and the goal of the game may be defined.

Third, the ALV operation includes a description of a playing strategy which gives a significant advantage over the primitive greedy approach. The present invention provides for an enhanced and evolutionary Monte Carlo Tree Search operation/method for single player games.

ALV Operation: Two Basic Transformations of Layout

In one or more embodiments, as a first definition ("definition 1") is denoting a maximum allowed population density ("target density") by d (e.g., $0 \le d \le 1$). As a second definition ("definition 2") is a convolution kernel is a non-negative function in two variables $K(x, y)$, such that:

$$\int_{-\infty}^{\infty} \int_{-\infty}^{\infty} K(x,y) dx\, dy = 1, \quad (3),$$

As a third definition ("definition 3") an indicator function of placement is a non-negative function in two variables as depicted in equation 4:

$$f(x, y) \stackrel{def}{=} \begin{cases} 0 & \text{if}(x, y) \text{belongs to the } b \text{ box and covered by any block} \\ \text{target density } d & \text{if}(x, y) \text{does not belong to the } b.\text{box} \\ 1(resp, 2, 3, \ldots) & \text{If}(x, y) \text{belongs to the } b.\text{box and is coverved by } 1(resp. 2, 3, \ldots) \text{block} \end{cases}$$

As a fourth definition ("definition 4") a population density function $D(x, y)$ of placement is a convolution of $f(x, y)$ and $K(x, y)$. As a fifth definition ("definition 5") maximum population density constraint is as follows: $D(x, y) \le d$ at every point $(x, y)$.

As a sixth definition ("definition 6") is a transformation of contraction. For transformation of contraction, let the current placement be given by the coordinates of the centers of the blocks $(u_1, v_1, u_2, v_2, \ldots, u_{|M|}, v_{|M|})$ and let $\alpha$, which is a "coefficient of contraction" and can be a real number between 0 and 1. For example, consider the following minimization problem of finding all minimums (min) over all $x_1, y_1, \ldots, x_{|M|}, y_{|M|}$ of $$\alpha \frac{\sum\nolimits_{allnets} w_j HPWL(\text{net}_j(x_1, y_1, \ldots, x_{|M|}, y_{|M|}))}{\text{total weight of all nets}} + \quad (5)$$

$$(1-\alpha) \frac{\sum\nolimits_{allnets} \alpha_j |x_i - u_i| + |x_i - v_i|}{\text{total area of all move blocks}},$$

where $w_j$ are weights of the nets and $a_i$, $i = 1, \ldots, |M|$ are areas of the movable blocks.

The transformation of contraction moves the centers of the blocks to the positions given by the solution vector $(x_1, y_1, x_2, y_2, \ldots, x_{|M|}, y_{|M|})$ of this problem. It should be noted that if $\alpha=1$ then the contraction transformation moves the blocks around to the positions which minimize the total weighted wire length, ignoring the original positions of the blocks, which may ruin the uniformity of population density across the design.

Alternatively, if $\alpha=0$ then the blocks remain in their original positions and the total contraction of all nets is zero. If $0<\alpha<1$, the blocks move part of the way from their original positions towards positions that minimize the total weighted wire length. Smaller blocks tend to move by longer distances and bigger blocks tend to stay closer to their original positions. For small enough a, the disturbance to the population density caused by contraction transformation can be repaired by a subsequent spreading transformation with a loss of only a part, but not all, of the wire length improvement.

For example, consider a problem (e.g., problem (1)) of minimization of a continuous piecewise linear convex function. By introducing an extra variables and a number of linear constraints the minimization of a continuous piecewise linear convex function can be reduced to a linear program. Moreover, this linear program has a special form of a dual to a maximum flow problem, which admits a very effective solution, for example by Edmonds-Karp algorithm.

As a seventh definition ("definition 7"), for a given placement of movable blocks $(x_1, y_1, x_2, y_2, \ldots, x_{|M|}, y_{|M|})$ define overpopulation penalty as $\iint (\max(0, D(x, y)-d))^2 \, dx \, dy$, where $D(x, y)$ is population density of the placement (see Definition 4 above).

An overpopulation penalty is a non-negative real valued function of placement, denote it by $P(x_1, y_1, x_2, y_2, \ldots, x_{|M|}, y_{|M|})$. The maximum population density constraint is satisfied if and only if $P(x_1, y_1, x_2, y_2, \ldots, x_{|M|}, y_{|M|})=0$.

As an eight definition ("definition 8") for transformation of spreading is as follows. While $(P(x_1, y_1, x_2, y_2, \ldots, x_{|M|}, y_{|M|})>0$, the following is performed.

For every movable block Mi try to move Mi to all possible, (design_row_height×design_row_height) cells on the squared grid inside of the bounding box. Consider only the movements $Mi \to (xi, yi)$, which strictly decrease overpopulation penalty: $P(u1, v1, \ldots, xi, yi, \ldots, u|M|, v|M|) < P(u1, v1, \ldots, ui, vi, \ldots, u|M|, v|M|)$. Among these movements choose the one for which $$\frac{\text{old}_{HPWL} - \text{new}_{HPWL}}{P(u_1, v_1, \ldots, u_i, v_i, \ldots, u_{|M|}, v_{|M|}) - P(u_1, v_1, \ldots, x_i, y_i, \ldots, u_{|M|}, v_{|M|})}, \quad (5)$$

is maxima and the movement is performed. It should be noted that that, since the cycle terminates only when the overpopulation penalty is zero, the result of the transformation of spreading is a placement which satisfies the maximum population density constraint.

As a ninth definition ("definition 9"), transformation of spreading testing only n movable blocks per cycle. In order to improve the run time of transformation of spreading one can reduce the number of movable blocks being tested during one iteration of the cycle from |M| to a much smaller fixed number n.

In the implementation of ALV operation, the maximum, enhanced, optimized, or best balance between the runtime and the quality of spreading is achieved at one determined value (e.g., n≈20). It should be noted that at each iteration three is the freedom to choose any subset of n movable blocks. Depending on the choice of these subsets transformation of spreading testing only n movable blocks per cycle can produce significantly different placements.

Global Placement as a Single Player Game with Perfect Information

In some implementations, a legal position in the game of global placement is a vector $(x_1, y_1, x_2, y_2, \ldots, x_{|M|}, y_{|M|})$ of integer coordinates of centers of movable blocks such that all blocks are positioned inside of the bounding box and the maximum density constrain $D(x, y) \leq d$ is satisfied.

The initial position is generated in two steps. First, in step 1), all blocks of the design may be placed at arbitrary locations such as, for example, at a lower left corner of the bounding box. The transformation of contraction with $\alpha=1$ may be applied. It should be noted that, since $\alpha=1$, the positions of blocks before the transformation do not affect the result of the transformation, see definition 6. Second, in step 2), the transformation of spreading may be applied. Transformation of spreading always results in a legal position, see definition 8.

The game always consists of one and the same number of moves $\mathcal{M}$, where $\mathcal{M}$ is a global parameter of the algorithm with a typical value between 10 and 30. At move number m, $1 \leq m \leq \mathcal{M}$, the value of a for the transformation of spreading is set to $1-m/\mathcal{M}$ and this way a decreases gradually from 1 to 0 during the game. The move is made as follows: a) remember the current wire length: old_HPWL, b) apply transformation of contraction with $\alpha=1-m/\mathcal{M}$, and c) apply transformation of spreading testing only n movable blocks per cycle, see Definition 9.

It should be noted that this transformation can be done in many different ways depending on the subsets of movable blocks, so many different moves can be played from a given position in the game. The spreading transformation always results in a position which satisfies the maximum population density constraint, so the position is legal after each move.

If $\text{new}_{HPWL}$ is greater than $\text{old}_{HPWL}$ (e.g., new_HPWL≤old_HPWL) the new position may be accepted, otherwise revert the position to what it was before the move. It should be noted that in practice contraction-spreading pair of transformation almost always decreases HPWL and the latter situation is extremely rare. The wire length decreases monotonically during the game.

The goal of the game is to achieve a final legal position which HPWL is as small as possible. As a tenth definition ("definition 10"), to play the game of placement randomly means to play it by choosing subsets of movable blocks randomly and independently from each other for each transformation of spreading testing only n movable blocks per cycle.

Evolutionary Monte Carlo Tree Search

The present invention provides for the evolutionary tree search which is to imitate the process of natural selection on the nodes of the game tree. Survival of an individual (a tree node) depends only on the figure of merit of its offspring, but not on the figure of merit of the node itself. In terms of placement this means that the objective function of a placement after m-th move is not based on the placement's own WL, but completely depends on the average WL of leaf node placements which it has produced by playing the game randomly to the end several times. Similar to the concept of a sacrifice in some games (e.g., chess), the present invention may sacrifice a quality (e.g., wire length) of a current solution (level m tree node) in order to produce a maximized, enhanced, optimized, and/or better final solution (e.g., leaf node) in the future.

The evolutionary tree search for a game tree search may include of a number of homogeneous iterations. Several data structures, including the best solution found so far, are maintained and updated during each iteration. The termination criterion is based on time only: the evolutionary tree search operation stops and outputs the current maximized, enhanced, optimized, and/or better solution when an initially given run time limit is exceeded. In order to describe the evolutionary tree search operations, the present invention 1) describe the data structures, 2) provides the initial state, and 3) illustrates what happens during one iteration.

In some implementations, the data structures may include a non-empty set of game tree nodes: "live organisms". Each organism contains the following information. A vector of coordinates of the centers of the movable objects: $(x_1, y_1, x_2, y_2, \ldots, x_{|M|}, y_{|M|})$. Mass of the organism. The mass is a non-negative real number which indicates "wellness" of the organism. Organisms with bigger mass produce more offspring on both m+1-th and $\mathcal{M}$-th levels of the game tree and are less likely to "die of starvation". A figure of merit ("FOM") of the organism. The FOM is minus average half perimeter wire length of all the leaf ($\mathcal{M}$-th levels) offspring of the organism. For example, assume the FOM as a kind of derivative of mass by time: organisms which FOM is high accumulate mass at each iteration, while organisms with low FOM lose their mass and eventually may die of starvation. To maintain the FOM, the present invention stores two numbers: the number of leaf nodes produced by the organism and the total HPWL of these leaf nodes. The best game result (the leaf node with the smallest HPWL) found so far.

Figure 7:
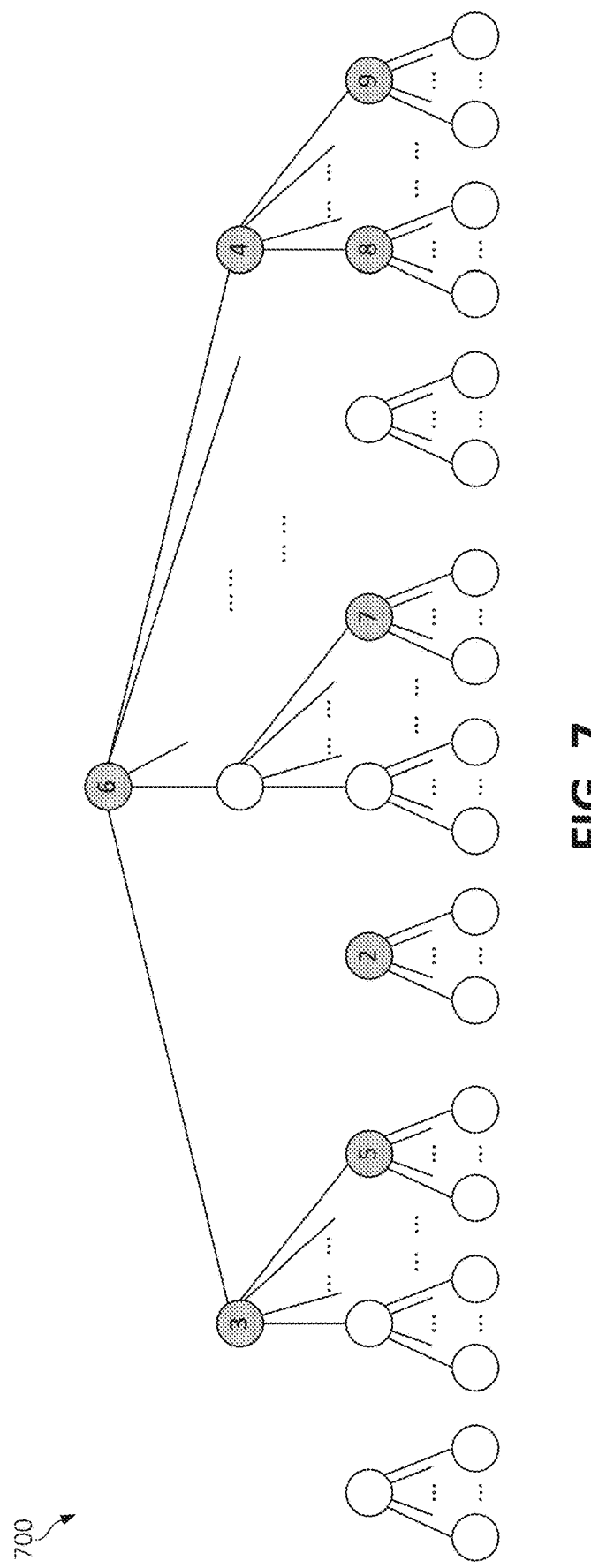
FIG. 7 is a diagram depicting an exemplary nodes of a game tree in which aspects of the present invention may be realized.
Figure 8A:
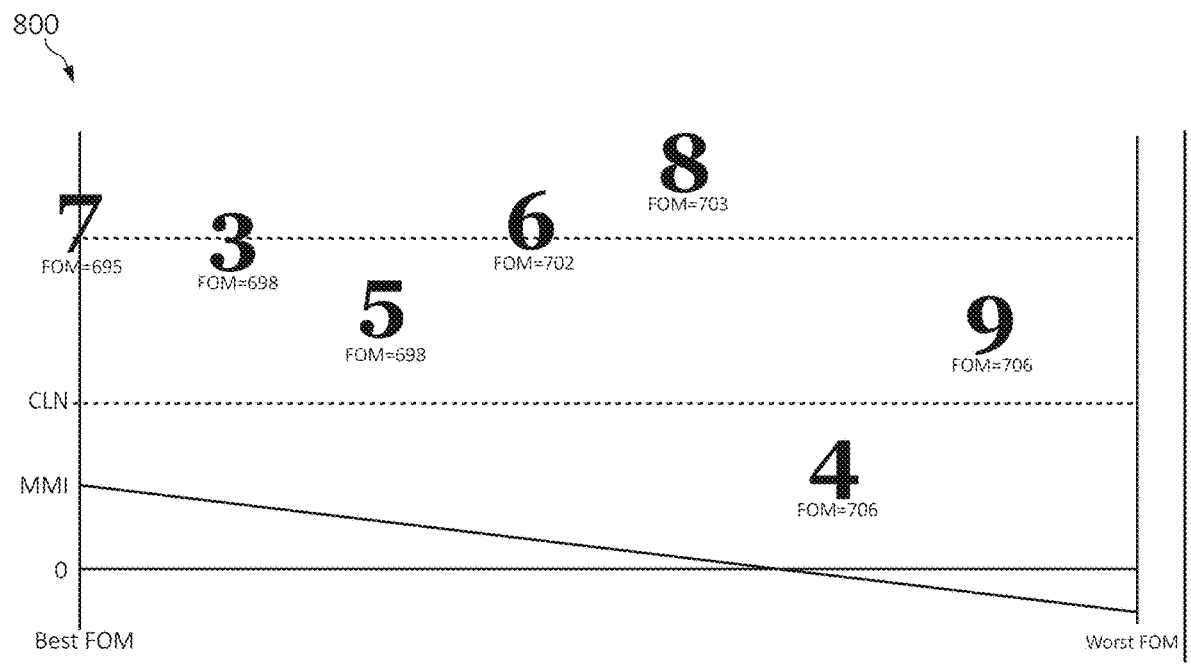
FIG. 8A is a diagram depicting node of a game tree on a graph as an ALV data structure in which aspects of the present invention may be realized.

For the initial state, the set of live organisms contains only one element for which the game of placement has been played randomly once (see definition 10) and one leaf node has been produced. The movable objects are at the initial position of the game and the mass=1.0 and the FOM=(-1)× half perimeter wire length of the only leaf node produced up to this point. The maximized, enhanced, optimized, and/or better game result is the only leaf node that has been produced up to this point Each iteration of the algorithm consists of three parts: 1) update living organisms' masses according to their FOM, 2) choose which living organism will perform the next action and 3) perform the action. To update the organisms' masses, the present invention may sort them in the order of decreasing FOM, as indicated in FIGS. 7 and 8A, where FIG. 7 is a diagram 700 depicting an exemplary nodes of a game tree and FIG. 8A is a diagram 800 depicting node of a game tree on a graph as an ALV data structure. As depicted in FIG. 7, the numerical digits (e.g., 3, 5, 2, 6, 7, 4, 8, and 9), by way of example only, represent the living organisms.

As depicted in FIG. 8A, the living organisms (e.g., the numerical digits such as, for example, 7, 3, 5, 6, 8, 9, 4, 9, 2) on a graph as an ALV data structure. On the graph diagram 800 of FIG. 8A, the organisms are sorted along X-axis left to right in the order of decreasing FOM. The Y-coordinate of each organism represents the living organism's current mass. The bold diagonal line going from the upper left to the lower right of the FIG. 8A is the graph of the mass increment/decrement function. This function is uniquely defined by the following three properties: a) the function is linear, b) the function's value for the organism's maximum, optimized, and/or best FOM is MMI, where MMI is a global parameter of the algorithm—"maximum mass increment", for example MMI=0.05, and c) The sum of mass increments/decrements of all organisms is equal to the "cost of leaf node ("CLN"), where CLN is a global parameter of the algorithm—"cost of leaf node" such as, for example, the CLN=0.1.

Figure 8B:
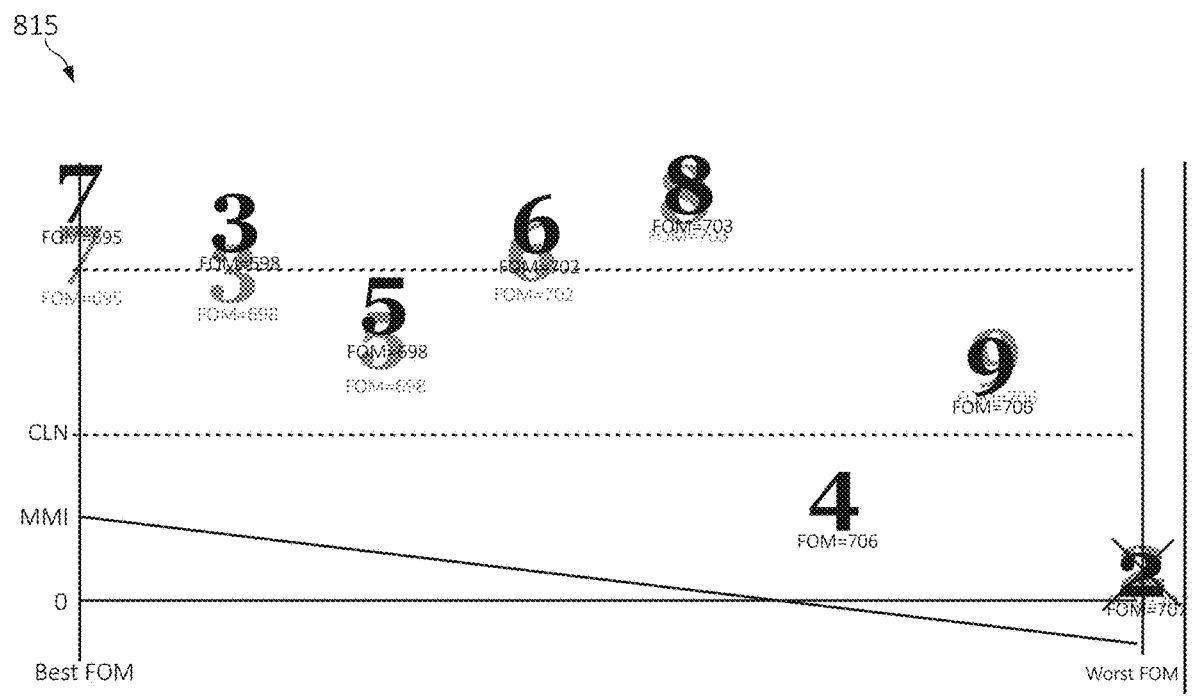
FIG. 8B is a diagram depicting an actions performed based on a highest mass by a node of a game tree in which aspects of the present invention may be realized.

In FIG. 8B, which is a graph diagram 815 depicting an actions performed based on a highest mass by a node of a game tree, the organism to perform the next action is the organism with the highest mass. The organisms which mass becomes less than zero "die of starvation" and get removed from the set of living organisms. The action can be of one of the following two types: produce a new living organism (an m+1-th level node) or play the game randomly to the end and produce a leaf placement node. In the randomized natural selection process, the former with probability y and the latter with probability 1−γ may be considered, where γ is a global parameter of the algorithm with a typical value between 0.15 and 0.3.

The mass of the organism, chosen to perform an action, is updated one more time as follows: If the action is a production of a new leaf node the mass is decreased by CLN.

If the action is a production of a new living organism, the mass is decreased by CLN and MNB, where MNB is the "mass of newborn" (e.g., the first item is present because a newborn organism always is forced to produce its first leaf node immediately after birth). MNB is a global parameter of the operation such as, for example, MNB=0.15.

It should be noted that after the mass updates in parts 1 (e.g., update the living organisms masses) and part 2 (e.g., selecting the organism to perform the next action) of the iteration the total mass of all living organisms does not change. Hence the mass conservation throughout the operation. It should be noted that the mass of living organisms' changes only slightly during each single iteration and thus the result of the previous iteration is not strictly required to start the next iteration. This makes ALV operation perfect for multithreaded implementation.

Optimization of Tunable Parameters of ALV Operation by Machine Learning Operation A quality of result of ALV operation depends on each of the values of global parameters such as, for example, height of the game tree $\mathcal{M}$, maximum mass increment, cost of leaf node, probability of producing a new organism y, pseudo-area of convolution kernel, etc. The total number of global parameters, by way of example only, of the implementation of ALV operation may be a determined value such as, for example, 26. A similar operation may be used to model fitting in machine learning in order to identify the maximum, enhanced, optimized, or best values of these parameter.

The present invention maximizes the average HPWL improvement over a large training set of actual VLSI designs as a function of the global parameters. For example, one iteration of maximization processes is extremely computationally expensive since there is a need to simulate natural selection, which by itself is a lengthy process, for each of the VLSI designs of a very large training set. Thus, an LBFGS operation may be employed, which is one of the most maximized, enhanced, optimized, or best minimization operations, used in machine learning in situations when a single computation of the objective function is extremely long, is LBFGS algorithm.

In some implementations, the optimization process needs to be run only once in the whole life of the placement tool. For example, an optimization run of the LBFGS used a training set of 50 actual VLSI designs and took 30 days on a 16-core processor. The global parameters, which maximized the average HPWL improvement has been permanently embedded into a C implementation of ALV global placement tool.

For further explanation, FIG. 9 is table diagram 900 depicting average wire length improvement in which aspects of the present invention may be realized.

In some implementations, the table diagram 900 represents the comparison of results of initial placement of a POWER10 design testbench by ALV operation compared to the same set of test cases by an initial placement tool shows more than 11% average improvement in wire length. The left column on FIG. 9 shows a name of the design, the wire length of initial placement and the wire length of initial placement by ALV. The large bold percentage numbers in the middle column is the wire length improvement achieved by ALV in comparison to the initial placement tool. The rightmost column shows the distribution of population density in the $8 \times \text{row}_{height}$ by $8 \times \text{row}_{height}$ square grid placed over the design.

Figure 10:
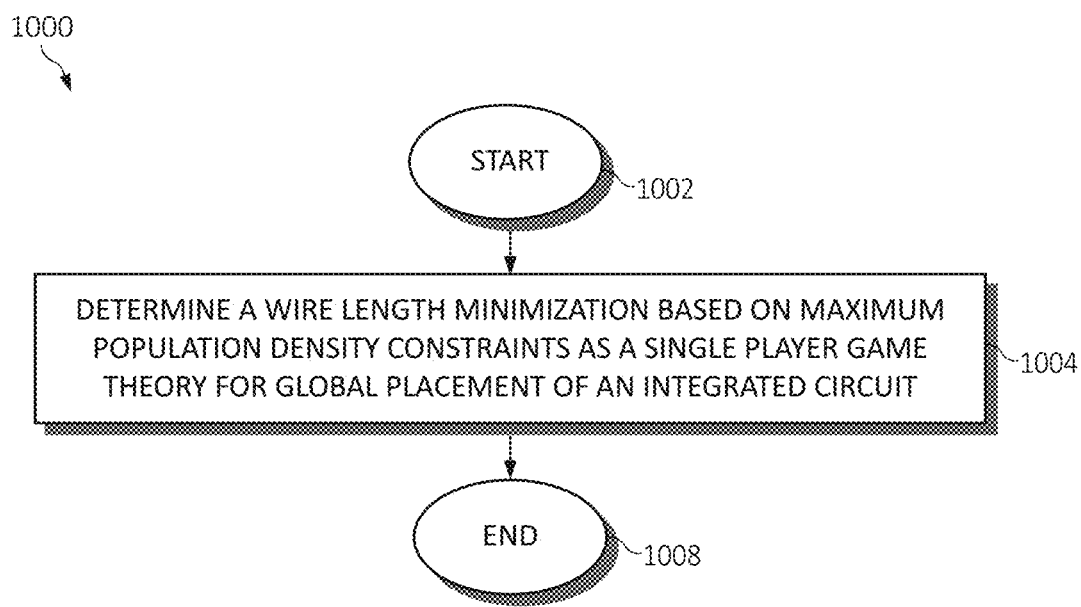
FIG. 10 is a flowchart diagram depicting an exemplary method for providing enhanced initial global placement in an integrated circuit by a processor, again in which aspects of the present invention may be realized.

Turning now to FIG. 10, a method 1000 for providing enhanced initial global placement in an integrated circuit using a processor is depicted, in which various aspects of the illustrated embodiments may be implemented. The functionality 1000 may be implemented as a method executed as instructions on a machine, where the instructions are included on at least one computer readable medium or one non-transitory machine-readable storage medium. The functionality 1000 may start in block 1002.

A wire length minimization may be determined based on maximum population density constraints as a single player game theory for global placement of an integrated circuit, as in block 1004. The functionality 1000 may end, as in block 1006.

In one aspect, in conjunction with and/or as part of at least one blocks of FIG. 10, the operation of method 1000 may include each of the following. The operations of 1000 may align a pair of gate pins for the one or more short nets using a heuristic operation. The operations of 1000 may simultaneously align a plurality of gate pin pairs of a plurality of short nets in the cell of the integrated circuit using an integer linear program ("ILP") operation, where the one or more short nets are aligned simultaneously.

The operations of 1000 may identify one or more alignment constraints for aligning the one or more of a plurality of short nets. The operations of 1000 may generate an alignment graph for aligning the one or more of a plurality of short nets, where each node of the alignment graph represents a row segment and indicates a number of gates associated with the node.

The operations of 1000 may perform a pair of design layout transformations as an operation of the single player game theory. The operations of 1000 may perform a partial contraction transformation of the design layout towards the minimum wire length placement.

The operations of 1000 may determine a formulated linear program for the partial contraction transformation. The operations of 1000 may spread transformation that corrects one or more population density violations while preserving an amount of wire length.

The operations of 1000 may determine a randomized greedy operations for the spreading transformation. The operations of 1000 may initiate a machine learning operation to model the wire length minimization based on the maximum population density constraints as a single player game theory.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The descriptions of the embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for providing enhanced initial global placement in a circuit design in a computing environment by one or more processors comprising:
    determining a wire length minimization based on maximum population density constraints as a single player game theory for global placement of an integrated circuit.

2. The method of claim 1, further including performing a pair of design layout transformations as an operation of the single player game theory.

3. The method of claim 2, wherein performing the pair of design layout transformations further includes performing a partial contraction transformation of the design layout towards the minimum wire length placement.

4. The method of claim 3, further including determining a formulated linear program for the partial contraction transformation.

5. The method of claim 2, wherein performing the pair of design layout transformations further includes spreading transformation that corrects one or more population density violations while preserving an amount of wire length.

6. The method of claim 5, further including determining a randomized greedy operations for the spreading transformation.

7. The method of claim 1, further including initiating a machine learning operation to model the wire length minimization based on the maximum population density constraints as the single player game theory.

8. A system for providing enhanced initial global placement in a computing environment in a computing environment, comprising:
    one or more computers with executable instructions that when executed cause the system to:
        determine a wire length minimization based on maximum population density constraints as a single player game theory for global placement of an integrated circuit.

9. The system of claim 8, wherein the executable instructions when executed cause the system to perform a pair of design layout transformations as an operation of the single player game theory.

10. The system of claim 9, wherein performing the pair of design layout transformations further includes perform a partial contraction transformation of the design layout towards the minimum wire length placement.

11. The system of claim 10, wherein the executable instructions when executed cause the system to determine a formulated linear program for the partial contraction transformation.

12. The system of claim 10, wherein the executable instructions when executed cause the system to determine a randomized greedy operations for the spreading transformation.

13. The system of claim 10, wherein the executable instructions when executed cause the system to initiate a machine learning operation to model the wire length minimization based on the maximum population density constraints as the single player game theory.

14. The system of claim 9, wherein performing the pair of design layout transformations further includes spread transformation that corrects one or more population density violations while preserving an amount of wire length.

15. A computer program product for providing enhanced initial global placement in a computing environment, the computer program product comprising:

one or more computer readable storage media, and program instructions collectively stored on the one or more computer readable storage media, the program instruction comprising:

program instructions to determine a wire length minimization based on maximum population density constraints as a single player game theory for global placement of an integrated circuit.

16. The computer program product of claim 15, further including program instructions to perform a pair of design layout transformations as an operation of the single player game theory.

17. The computer program product of claim 15, further including program instructions to perform a partial contraction transformation of the design layout towards the minimum wire length placement.

18. The computer program product of claim 15, further including program instructions to determine a formulated linear program for the partial contraction transformation.

19. The computer program product of claim 15, further including program instructions to:

spread transformation that corrects one or more population density violations while preserving an amount of wire length; and determine a randomized greedy operations for the spreading transformation.

20. The computer program product of claim 15, further including program instructions to initiate a machine learning operation to model the wire length minimization based on the maximum population density constraints as the single player game theory.

* * * * *